US012742827B2

(12) United States Patent
Xu et al.

(10) Patent No.: US 12,742,827 B2
(45) Date of Patent: Sep. 22, 2026

(54) POWER SUPPLY SYSTEM AND IV CURVE SCANNING METHOD FOR POWER SUPPLY SYSTEM

(71) Applicant: Huawei Digital Power Technologies Co., Ltd., Shenzhen (CN)

(72) Inventors: Zhiwu Xu, Shenzhen (CN); Jialong Xu, Shenzhen (CN); Haibin Guo, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 432 days.

(21) Appl. No.: 18/455,920

(22) Filed: Aug. 25, 2023

(65) Prior Publication Data

US 2023/0400524 A1 Dec. 14, 2023

Related U.S. Application Data

(63) Continuation of application No. PCT/CN2021/078265, filed on Feb. 26, 2021.

(51) Int. Cl.
*G01R 31/3842* (2019.01)
*H02S 50/10* (2014.01)

(52) U.S. Cl.
CPC .......... *G01R 31/3842* (2019.01); *H02S 50/10* (2014.12)

(58) Field of Classification Search
CPC ............................ G01R 31/3842; H02S 50/10
See application file for complete search history.

(56) References Cited

U.S. PATENT DOCUMENTS

2009/0283129 A1* 11/2009 Foss ...................... H02M 7/493 136/244
2012/0025621 A1* 2/2012 Seymour ............... H10F 19/902 307/81
2013/0307336 A1* 11/2013 Bundschuh ........... H10F 77/955 307/43
2016/0064935 A1* 3/2016 Gao ......................... H03K 7/08 307/82

FOREIGN PATENT DOCUMENTS

CN 105785329 A 7/2016
CN 107196604 A 9/2017
CN 112290888 A * 1/2021 ............. H02S 10/00

* cited by examiner

*Primary Examiner* — Catherine T. Rastovski
*Assistant Examiner* — Sharad Timilsina
(74) *Attorney, Agent, or Firm* — Maier & Maier, PLLC

(57) ABSTRACT

A power supply system and an IV curve scanning method for a power supply system. The power supply system includes at least a first inverter and a second inverter. The first inverter starts, at an IV curve scanning start time of the first inverter, to perform IV curve scanning on a string connected to the first inverter, and the second inverter starts, at an IV curve scanning start time of the second inverter, to perform IV curve scanning on a string connected to the second inverter. Their IV curve scanning start time is different. In addition, a time interval between the IV curve scanning their start time is less than a preset IV curve scanning period. In the embodiments, fluctuation of an output power of the power supply system during IV curve scanning can be reduced, thereby improving system stability of the power supply system.

18 Claims, 5 Drawing Sheets

$V_{out}$
$V_{oc}$
0 $t_1$ $T/2+t_1$ $T+t_1$ $t$ $V_{out}$
$V_{oc}$
0 $t_1$ $T/2+t_1$ $T+t_1$ $t$ A first inverter starts, at an IV curve scanning start time of the first inverter, to perform IV curve scanning on at least one string connected to the first inverter

Figure 6:
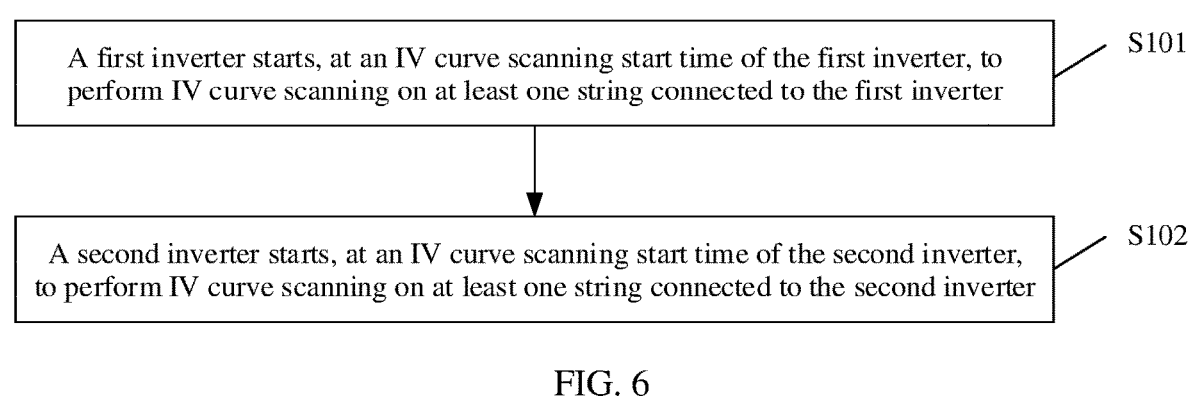

S101

A second inverter starts, at an IV curve scanning start time of the second inverter, to perform IV curve scanning on at least one string connected to the second inverter

POWER SUPPLY SYSTEM AND IV CURVE SCANNING METHOD FOR POWER SUPPLY SYSTEM

CROSS-REFERENCE TO RELATED APPLICATIONS

This application is a continuation of International Application No. PCT/CN2021/078265, filed on Feb. 26, 2021, the disclosure of which is hereby incorporated by reference in its entirety.

TECHNICAL FIELD

The embodiments relate to the field of power supply technologies and to a power supply system and an IV curve scanning method for a power supply system.

BACKGROUND

A string includes a plurality of photovoltaic modules or a plurality of batteries connected in series, and a plurality of strings may be connected in parallel to form a power supply system. The power supply system may be widely applied to scenarios such as solar power generation and an uninterruptible power supply.

Currently, there are mainly two IV curve scanning methods a string in the power supply system. One method is that after one inverter completes IV curve scanning on a string connected to the inverter, another inverter starts to perform IV curve scanning on a string connected to the another inverter until all inverters complete scanning. The other method is that all inverters simultaneously perform IV curve scanning on strings connected to the inverters until scanning is completed. However, the foregoing two manners both have the following problem: in an IV curve scanning process, because an output voltage of the string rapidly changes, an output power of an inverter connected to the string fluctuates greatly. Consequently, an output power of the power supply system fluctuates greatly.

SUMMARY

The embodiments include a power supply system and an IV curve scanning method for a power supply system, so that phases of string voltage curves of inverters can be staggered in an IV curve scanning process, thereby reducing fluctuation of an output power of the power supply system, improving system stability of the power supply system in the IV curve scanning process, and having high applicability.

According to a first aspect, the embodiments provide a power supply system, where the power supply system includes at least two inverters, each of the at least two inverters is configured to connect to at least one string, and the at least two inverters include a first inverter and a second inverter. The first inverter starts, at an IV curve scanning start time of the first inverter, to perform IV curve scanning on at least one string connected to the first inverter, and the second inverter starts, at an IV curve scanning start time of the second inverter, to perform IV curve scanning on at least one string connected to the second inverter. The IV curve scanning start time of the first inverter is determined based on a moment at which a first IV curve scanning instruction is received and a delay duration of the first inverter. The IV curve scanning start time of the second inverter is determined based on a moment at which a second IV curve scanning instruction is received and a delay duration of the second inverter. The IV curve scanning start time of the first inverter and the IV curve scanning start time of the second inverter are different. In addition, a time interval between the IV curve scanning start time of the first inverter and the IV curve scanning start time of the second inverter is less than a preset IV curve scanning period.

In this embodiment, each inverter starts, at an IV curve scanning start time of the inverter, to perform IV curve scanning on each string connected to the inverter. The IV curve scanning start times of the inverters in the at least two inverters are different, and a time interval between IV curve scanning start times of any two inverters in the at least two inverters is less than the preset IV curve scanning period. Therefore, phases of string voltage curves of the inverters are staggered in an IV curve scanning process, thereby reducing fluctuation of an output power of the power supply system, improving system stability of the power supply system in the IV curve scanning process, and having high applicability.

With reference to the first aspect, in a first possible implementation, before starting, at the IV curve scanning start time of the first inverter, to perform IV curve scanning on the at least one string connected to the first inverter, the first inverter determines the delay duration of the first inverter based on a preset configuration parameter of the first inverter; and before starting, at the IV curve scanning start time of the second inverter, to perform IV curve scanning on the at least one string connected to the second inverter, the second inverter determines the delay duration of the second inverter based on a preset configuration parameter of the second inverter.

In this embodiment, when the received IV curve scanning instruction carries no scanning parameter, each inverter may determine the delay duration of the inverter based on the preset configuration parameter of the inverter.

With reference to the first aspect, in a second possible implementation, the preset configuration parameter includes a quantity of the at least two inverters, the preset IV curve scanning period, and ranking of a corresponding inverter in the at least two inverters.

In this embodiment, when the preset configuration parameter of each inverter includes the quantity of the at least two inverters, the preset IV curve scanning period, and the ranking of the inverter in the at least two inverters, each inverter may determine the delay duration of the inverter based on the quantity of the at least two inverters, the preset IV curve scanning period, and the ranking of the inverter in the at least two inverters.

With reference to the first aspect, in a third possible implementation, before starting, at the IV curve scanning start time of the first inverter, to perform IV curve scanning on the at least one string connected to the first inverter, the first inverter determines the delay duration of the first inverter based on a scanning parameter carried in the first IV curve scanning instruction; and before starting, at the IV curve scanning start time of the second inverter, to perform IV curve scanning on the at least one string connected to the second inverter, the second inverter determines the delay duration of the second inverter based on a scanning parameter carried in the second IV curve scanning instruction.

In this embodiment, when the IV curve scanning instruction carries the scanning parameter, each inverter may determine the delay duration of the inverter based on the scanning parameter.

With reference to the first aspect, in a fourth possible implementation, the scanning parameter includes a quantity of the at least two inverters, the preset IV curve scanning period, and ranking of a corresponding inverter in the at least two inverters.

In this embodiment, when the scanning parameter of each inverter includes the quantity of the at least two inverters, the preset IV curve scanning period, and the ranking of the inverter in the at least two inverters, each inverter may determine the delay duration of the inverter based on the quantity of the at least two inverters, the preset IV curve scanning period, and the ranking of the inverter in the at least two inverters.

With reference to the first aspect, in a fifth possible implementation, the delay duration of the first inverter is $T/N*(n_1-1)$, and the delay duration of the second inverter is $T/N*(n_2-1)$, where T is the preset IV curve scanning period, N is the quantity of the at least two inverters, $n_1$ is ranking of the first inverter in the at least two inverters, and $n_2$ is ranking of the second inverter in the at least two inverters.

In this embodiment, the inverter may obtain the delay duration $T/N*(n-1)$ of the inverter through calculation based on the quantity N of the at least two inverters, the preset IV curve scanning period T, and the ranking n of the inverter in all the inverters. Therefore, in an IV curve scanning process, phases of string voltage curves of the inverters are evenly staggered, and phases of string output power curves of the inverters are evenly staggered, so that an output power of the power supply system is further constant, and applicability is higher.

With reference to the first aspect, in a sixth possible implementation, when the first inverter is connected to a plurality of strings, the first inverter starts, at the IV curve scanning start time of the first inverter based on a preset scanning sequence, to sequentially perform IV curve scanning on the strings connected to the first inverter.

In this embodiment, when the inverter is connected to a plurality of strings (for example, a string 1 and a string 2), the inverter may start to perform IV curve scanning on the string 1 at the IV curve scanning start time, and start to perform IV curve scanning on the string 2 when scanning on the string 1 ends. Therefore, the inverter has at least one string in a normal state in an IV curve scanning process, thereby ensuring that the inverter still has a specific output power, and reducing fluctuation of an output power of the power supply system.

With reference to the first aspect, in a seventh possible implementation, the scanning period includes a fall phase scanning period and a rise phase scanning period, and the at least one string connected to the first inverter includes a first string. After starting, at the IV curve scanning start time of the first inverter, to perform IV curve scanning on the at least one string connected to the first inverter, the first inverter compares fall phase scanning data of the first string in the fall phase scanning period with rise phase scanning data of the first string in the rise phase scanning period, and outputs an IV curve scanning result of the first string based on a comparison result.

In this embodiment, after completing IV curve scanning on the first string connected to the inverter, the inverter may output the IV curve scanning result of the first string based on the comparison result between the fall phase scanning data of the first string in the fall phase scanning period and the rise phase scanning data of the first string in the rise phase scanning period, so that accuracy of the IV curve scanning result of the string can be improved.

According to a second aspect, the embodiments provide an IV curve scanning method for a power supply system, where the power supply system includes at least two inverters, each of the at least two inverters is configured to connect to at least one string, and the at least two inverters include a first inverter and a second inverter. The first inverter starts, at an IV curve scanning start time of the first inverter, to perform IV curve scanning on at least one string connected to the first inverter, and the second inverter starts, at an IV curve scanning start time of the second inverter, to perform IV curve scanning on at least one string connected to the second inverter. The IV curve scanning start time of the first inverter is determined based on a moment at which a first IV curve scanning instruction is received and a delay duration of the first inverter. The IV curve scanning start time of the second inverter is determined based on a moment at which a second IV curve scanning instruction is received and a delay duration of the second inverter. The IV curve scanning start time of the first inverter and the IV curve scanning start time of the second inverter are different. In addition, a time interval between the IV curve scanning start time of the first inverter and the IV curve scanning start time of the second inverter is less than a preset IV curve scanning period.

In this embodiment, each inverter starts, at an IV curve scanning start time of the inverter, to perform IV curve scanning on each string connected to the inverter. The IV curve scanning start times of the inverters in the at least two inverters are different, and a time interval between IV curve scanning start times of any two inverters in the at least two inverters is less than the preset IV curve scanning period. Therefore, phases of string voltage curves of the inverters are staggered in an IV curve scanning process, thereby reducing fluctuation of an output power of the power supply system, improving system stability of the power supply system in the IV curve scanning process, and having high applicability.

With reference to the second aspect, in a first possible implementation, before the first inverter starts, at the IV curve scanning start time of the first inverter, to perform IV curve scanning on the at least one string connected to the first inverter, the first inverter determines the delay duration of the first inverter based on a preset configuration parameter of the first inverter, and determines the IV curve scanning start time of the first inverter based on the moment at which the first IV curve scanning instruction is received and the delay duration of the first inverter; before the second inverter starts, at the IV curve scanning start time of the second inverter, to perform IV curve scanning on the at least one string connected to the second inverter, the second inverter determines the delay duration of the second inverter based on a preset configuration parameter of the second inverter, and determines the IV curve scanning start time of the second inverter based on the moment at which the second IV curve scanning instruction is received and the delay duration of the second inverter.

In this embodiment, when the received IV curve scanning instruction carries no scanning parameter, each inverter may determine the delay duration of the inverter based on the preset configuration parameter of the inverter, and determine the IV curve scanning start time of the inverter based on the moment at which the inverter receives the IV curve scanning instruction and the delay duration of the inverter.

With reference to the second aspect, in a second possible implementation, the preset configuration parameter of the inverter includes a quantity of the at least two inverters, the preset IV curve scanning period, and ranking of a corresponding inverter in the at least two inverters.

In this embodiment, when the preset configuration parameter of each inverter includes the quantity of the at least two inverters, the preset IV curve scanning period, and the ranking of the inverter in the at least two inverters, each inverter may determine the delay duration of the inverter based on the quantity of the at least two inverters, the preset IV curve scanning period, and the ranking of the inverter in the at least two inverters.

With reference to the second aspect, in a third possible implementation, before the first inverter starts, at the IV curve scanning start time of the first inverter, to perform IV curve scanning on the at least one string connected to the first inverter, the first inverter determines the delay duration of the first inverter based on a scanning parameter carried in the first IV curve scanning instruction, and determines the IV curve scanning start time of the first inverter based on the moment at which the first IV curve scanning instruction is received and the delay duration of the first inverter; before the second inverter starts, at the IV curve scanning start time of the second inverter, to perform IV curve scanning on the at least one string connected to the second inverter, the second inverter determines the delay duration of the second inverter based on a scanning parameter carried in the second IV curve scanning instruction, and determines the IV curve scanning start time of the second inverter based on the moment at which the second IV curve scanning instruction is received and the delay duration of the second inverter.

In this embodiment, when the IV curve scanning instruction carries the scanning parameter, each inverter may determine the delay duration of the inverter based on the scanning parameter.

With reference to the second aspect, in a fourth possible implementation, the scanning parameter includes a quantity of the at least two inverters, the preset IV curve scanning period, and ranking of a corresponding inverter in the at least two inverters.

In this embodiment, when the scanning parameter of each inverter includes the quantity of the at least two inverters, the preset IV curve scanning period, and the ranking of the inverter in the at least two inverters, each inverter may determine the delay duration of the inverter based on the quantity of the at least two inverters, the preset IV curve scanning period, and the ranking of the inverter in the at least two inverters.

With reference to the second aspect, in a fifth possible implementation, the delay duration of the first inverter is $T/N*(n_1-1)$, and the delay duration of the second inverter is $T/N*(n_2-1)$, where T is the preset IV curve scanning period, N is the quantity of the at least two inverters, $n_1$ is ranking of the first inverter in the at least two inverters, and $n_2$ is ranking of the second inverter in the at least two inverters.

In this embodiment, the inverter may obtain the delay duration $T/N*(n-1)$ of the inverter through calculation based on the quantity N of the at least two inverters, the preset IV curve scanning period T, and the ranking n of the inverter in all the inverters. Therefore, in an IV curve scanning process, phases of string voltage curves of the inverters are evenly staggered, and phases of string output power curves of the inverters are evenly staggered, so that an output power of the power supply system is further constant, and applicability is higher.

With reference to the second aspect, in a sixth possible implementation, when the first inverter is connected to a plurality of strings, the first inverter starts, at the IV curve scanning start time of the first inverter based on a preset scanning sequence, to sequentially perform IV curve scanning on the strings connected to the first inverter.

In this embodiment, when the inverter is connected to a plurality of strings (for example, a string 1 and a string 2), the inverter may start to perform IV curve scanning on the string 1 at the IV curve scanning start time, and start to perform IV curve scanning on the string 2 when scanning on the string 1 ends. Therefore, the inverter has at least one string in a normal state in an IV curve scanning process, thereby ensuring that the inverter still has a specific output power, and reducing fluctuation of an output power of the power supply system.

With reference to the second aspect, in a seventh possible implementation, the preset IV curve scanning period includes a fall phase scanning period and a rise phase scanning period, and the at least one string connected to the first inverter includes a first string. The first inverter compares fall phase scanning data of the first string in the fall phase scanning period with rise phase scanning data of the first string in the rise phase scanning period, and outputs an IV curve scanning result of the first string based on a comparison result.

In this embodiment, after completing IV curve scanning on the first string connected to the inverter, the inverter may output the IV curve scanning result of the first string based on the comparison result between the fall phase scanning data of the first string in the fall phase scanning period and the rise phase scanning data of the first string in the rise phase scanning period, so that accuracy of the IV curve scanning result of the string can be improved.

According to a third aspect, the embodiments provide a power supply system, where the power supply system includes a system control unit and at least two inverters that establish a communication connection to the system control unit, each of the at least two inverters is configured to connect to at least one string, and the at least two inverters include a first inverter and a second inverter. The system control unit sends a first IV curve scanning instruction to the first inverter, and sends a second IV curve scanning instruction to the second inverter. The first inverter starts, at an IV curve scanning start time of the first inverter, to perform IV curve scanning on at least one string connected to the first inverter, and the second inverter starts, at an IV curve scanning start time of the second inverter, to perform IV curve scanning on at least one string connected to the second inverter. The IV curve scanning start time of the first inverter is determined based on a moment at which the first IV curve scanning instruction is received and a delay duration of the first inverter. The IV curve scanning start time of the second inverter is determined based on a moment at which the second IV curve scanning instruction is received and a delay duration of the second inverter. The IV curve scanning start time of the first inverter and the IV curve scanning start time of the second inverter are different. In addition, a time interval between the IV curve scanning start time of the first inverter and the IV curve scanning start time of the second inverter is less than a preset IV curve scanning period.

In this embodiment, the IV curve scanning start times of the inverters in the at least two inverters are different, and a time interval between IV curve scanning start times of any two inverters in the at least two inverters is less than the preset IV curve scanning period. Therefore, phases of string voltage curves of the inverters are staggered in an IV curve scanning process, thereby reducing fluctuation of an output power of the power supply system, improving system stability of the power supply system in the IV curve scanning process, and having high applicability.

With reference to the third aspect, in a first possible implementation, the first IV curve scanning instruction carries the delay duration of the first inverter, and the second IV curve scanning instruction carries the delay duration of the second inverter. Before sending the first IV curve scanning instruction to the first inverter and sending the second IV curve scanning instruction to the second inverter, the system control unit determines the delay duration of the first inverter and the delay duration of the second inverter based on a quantity of the at least two inverters, the preset IV curve scanning period, and ranking of the first inverter and the second inverter in the at least two inverters.

In this embodiment, when the IV curve scanning instruction sent to each inverter carries the delay duration of the corresponding inverter, the system control unit may determine the delay duration of the inverter based on the quantity of the at least two inverters, the preset IV curve scanning period, and the ranking of the inverter in the at least two inverters.

With reference to the third aspect, in a second possible implementation, the delay duration of the first inverter is $T/N*(n_1-1)$, and the delay duration of the second inverter is $T/N*(n_2-1)$, where T is the preset IV curve scanning period, N is the quantity of the at least two inverters, $n_1$ is ranking of the first inverter in the at least two inverters, and $n_2$ is ranking of the second inverter in the at least two inverters.

In this embodiment, the system control unit may obtain the delay duration $T/N*(n-1)$ of the inverter through calculation based on the quantity N of the at least two inverters, the preset IV curve scanning period T, and the ranking n of the inverter in all the inverters. Therefore, in an IV curve scanning process, phases of string voltage curves of the inverters are evenly staggered, and phases of string output power curves of the inverters are evenly staggered, so that an output power of the power supply system is further constant, and applicability is higher.

In the embodiments, phases of string voltage curves of inverters can be staggered in an IV curve scanning process, thereby reducing fluctuation of an output power of the power supply system, improving system stability of the power supply system in the IV curve scanning process, and having high applicability.

BRIEF DESCRIPTION OF DRAWINGS

FIG. 6 is a schematic flowchart of an IV curve scanning method for a power supply system according to the embodiments.

DETAILED DESCRIPTION OF EMBODIMENTS

Figure 1:
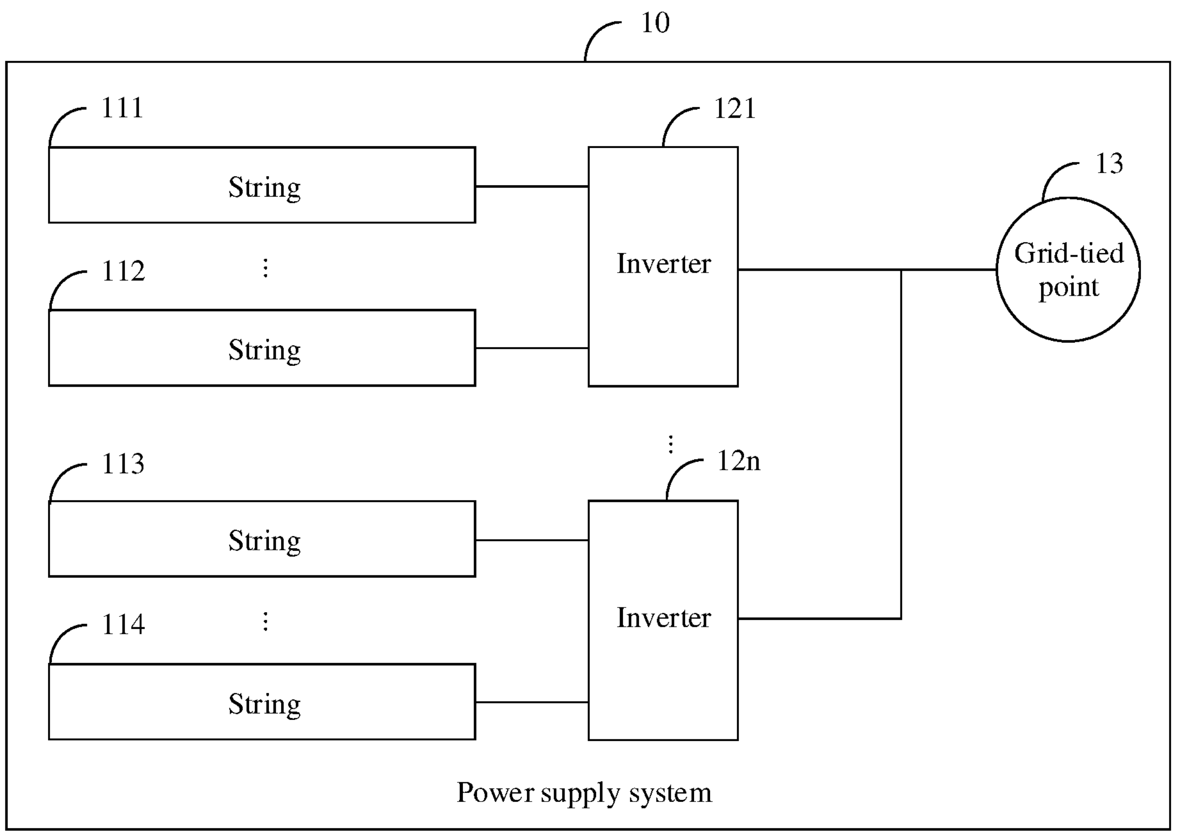
FIG. 1 is a schematic diagram of a structure of a power supply system according to the embodiments.

A large amount of statistical data of a power supply system shows that a quality problem in an initial phase and a fault generated in a final phase of a string are important factors that affect energy yield of the power supply system. When a temperature and irradiance remain unchanged, an output current of the string changes with an output voltage that changes from an open-circuit voltage to a short-circuit voltage, and a current-voltage curve (which is briefly referred to as an "IV curve" below) of the string can be drawn. This process is referred to as IV curve scanning of the string. If the string has been damaged, the IV curve of the string is distorted. In addition, for a photovoltaic string, when the photovoltaic string is shaded, an IV curve of the photovoltaic string is also distorted. Therefore, a health status of the string can be diagnosed through IV curve scanning, to provide a basis for operation and maintenance of the string. However, in an IV curve scanning process, because an output voltage of the string rapidly changes, an output power of an inverter connected to the string easily fluctuates greatly. Consequently, an output power of the power supply system fluctuates greatly, and system stability of the power supply system in the IV curve scanning process is poor. In addition, if the output power of the power supply system fluctuates greatly, a voltage of a power grid easily oscillates. This is unfavorable to stability of the power grid.

According to a power supply system and an IV curve scanning method for a power supply system provided in the embodiments, phases of string voltage curves of inverters can be staggered in an IV curve scanning process, thereby reducing fluctuation of an output power of the power supply system, improving system stability of the power supply system in the IV curve scanning process, and having high applicability. It should be noted that the IV curve scanning method for a power supply system provided in the embodiment is an IV curve scanning method for a string in the power supply system.

In an optional embodiment, the solutions of the embodiments may be applied to a photovoltaic scenario. In this case, each string included in the power supply system provided in the embodiments is a photovoltaic string, and each photovoltaic string may include a plurality of photovoltaic modules connected in series and/or in parallel. The power supply system may further include at least two inverters. The inverter is connected to at least one photovoltaic string, and is configured to convert, through inversion, a direct current generated by the photovoltaic string connected to the inverter into an alternating current that meets a requirement of a mains power grid. The power supply system can transmit, to the power grid, the alternating current obtained through inversion. In an optional implementation scenario, the power supply system may be further applied to an uninterruptible power supply scenario, that is, an energy storage battery such as a Ni—Cd battery, a NiMH battery, a lithium-ion battery, or a lithium polymer battery may be disposed between the inverter and the power grid.

A system control unit in the power supply system sends an IV curve scanning instruction to each inverter. After receiving the IV curve scanning instruction, each inverter determines an IV curve scanning start time of the inverter based on a moment at which the IV curve scanning instruction is received and a delay duration of the inverter, and starts, at the IV curve scanning start time of the inverter, to perform IV curve scanning on at least one photovoltaic string connected to the inverter. An IV curve scanning start time of a first inverter and an IV curve scanning start time of a second inverter in the at least two inverters are different. In addition, a time interval between the IV curve scanning start time of the first inverter and the IV curve scanning start time of the second inverter is less than a preset IV curve scanning period. In the foregoing IV curve scanning manner of the string, it can be ensured that the IV curve scanning start time of the first inverter and the IV curve scanning start time of the second inverter are distributed in a staggered manner in one preset IV curve scanning period. Therefore, in an IV curve scanning process, phases of a voltage curve of a photovoltaic string of the first inverter and a voltage curve of a photovoltaic string of the second inverter are staggered, and phases of an output power curve of the photovoltaic string of the first inverter and an output power curve of the photovoltaic string of the second inverter are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

In another optional embodiment, the solutions of the embodiments may be applied to a photovoltaic scenario in which a plurality of devices are connected in parallel. In this case, each string in the power supply system provided in the embodiments may be a photovoltaic string or an energy storage battery string, and each energy storage battery string may include a plurality of energy storage batteries connected in series and/or in parallel. The power supply system may further include at least two inverters. The inverter may be connected to at least one photovoltaic string, and is configured to convert, through inversion, a direct current generated by the photovoltaic string connected to the inverter into an alternating current that meets a requirement of a mains power grid. Alternatively, the inverter may be connected to at least one energy storage battery string, and is configured to convert, through inversion, a direct current generated by the energy storage battery string connected to the inverter into an alternating current that meets a requirement of a mains power grid. For example, the power supply system includes an inverter A and an inverter B in total. The inverter A is connected to at least one photovoltaic string, and the inverter B is connected to at least one energy storage battery string. The power supply system can transmit, to the power grid, the alternating current obtained through inversion. In an optional implementation scenario, the power supply system may be further applied to an uninterruptible power supply scenario, that is, an energy storage battery such as a Ni—Cd battery, a NiMH battery, a lithium-ion battery, or a lithium polymer battery may be disposed between the inverter and the power grid.

A system control unit in the power supply system sends an IV curve scanning instruction to each inverter. After receiving the IV curve scanning instruction, each inverter determines an IV curve scanning start time of the inverter based on a moment at which the IV curve scanning instruction is received and a delay duration of the inverter, and starts, at the IV curve scanning start time of the inverter, to perform IV curve scanning on at least one photovoltaic string or energy storage battery string connected to the inverter. An IV curve scanning start time of a first inverter and an IV curve scanning start time of a second inverter in the at least two inverters are different. In addition, a time interval between the IV curve scanning start time of the first inverter and the IV curve scanning start time of the second inverter is less than a preset IV curve scanning period. In the foregoing IV curve scanning manner of the string, it can be ensured that the IV curve scanning start time of the first inverter and the IV curve scanning start time of the second inverter are distributed in a staggered manner in one preset IV curve scanning period. Therefore, in an IV curve scanning process, phases of a string voltage curve of the first inverter and a string voltage curve of the second inverter are staggered, and phases of a string output power curve of the first inverter and a string output power curve of the second inverter are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

In still another optional embodiment, the solution of the embodiments may be applied to a battery charging/discharging scenario. In this case, each string included in the power supply system provided in the embodiments is an energy storage battery string, and each energy storage battery string may include a plurality of energy storage batteries connected in series and/or in parallel. The power supply system may further include at least two inverters. The inverter is connected to at least one energy storage battery string, and is configured to convert, through inversion, a direct current generated by the energy storage battery string connected to the inverter into an alternating current that meets a requirement of a mains power grid. The power supply system can transmit, to the power grid, the alternating current obtained through inversion. In an optional implementation scenario, the power supply system may be further applied to an uninterruptible power supply scenario, that is, an energy storage battery such as a Ni—Cd battery, a NiMH battery, a lithium-ion battery, or a lithium polymer battery may be disposed between the inverter and the power grid.

A system control unit in the power supply system sends an IV curve scanning instruction to each inverter. After receiving the IV curve scanning instruction, each inverter determines an IV curve scanning start time of the inverter based on a moment at which the IV curve scanning instruction is received and a delay duration of the inverter, and starts, at the IV curve scanning start time of the inverter, to perform IV curve scanning on at least one energy storage battery string connected to the inverter. An IV curve scanning start time of a first inverter and an IV curve scanning start time of a second inverter in the at least two inverters are different. In addition, a time interval between the IV curve scanning start time of the first inverter and the IV curve scanning start time of the second inverter is less than a preset IV curve scanning period. In the foregoing IV curve scanning manner of the string, it can be ensured that the IV curve scanning start time of the first inverter and the IV curve scanning start time of the second inverter are distributed in a staggered manner in one preset IV curve scanning period. Therefore, in an IV curve scanning process, phases of a voltage curve of an energy storage battery string of the first inverter and a voltage curve of an energy storage battery string of the second inverter are staggered, and phases of an output power curve of the energy storage battery string of the first inverter and an output power curve of the energy storage battery string of the second inverter are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

Optionally, the system control unit may be an independent device, or may be integrated into another device in the power supply system, for example, integrated into one of the inverters.

The foregoing description is merely an example of an application scenario of the power supply system provided in the embodiments, and is not exhaustive. The application scenario is not limited in the embodiments.

FIG. 1 is a schematic diagram of a structure of a power supply system according to the embodiments. As shown in FIG. 1, a power supply system 10 includes at least two inverters, and may include an inverter 121, . . . , and an inverter 12*n*, where n is an integer greater than or equal to 2. An input end of the inverter 121 may be connected to an output end of at least one string in a string 111, . . . , and a string 112, and an input end of the inverter 12*n* may be connected to an output end of at least one string in a string 113, . . . , and a string 114. Output ends of the inverter 121, . . . , and the inverter 12*n* are all connected to a grid-tied point 13. All strings connected to the inverter may be photovoltaic strings, or may be energy storage battery strings. The photovoltaic string is a direct current power supply formed by connecting a plurality of photovoltaic modules in series and/or in parallel. The photovoltaic module is a direct current power supply formed by connecting solar cells in series and in parallel and packaging the solar cells, and is configured to convert solar energy into electric energy. The energy storage battery string is a direct current power supply formed by connecting a plurality of energy storage batteries in series and/or in parallel. The inverter is configured to perform IV curve scanning on a string connected to the inverter, to detect whether the string connected to the inverter has a defect or is damaged. The inverter may be further configured to: convert a direct current output by the string into an alternating current, and then output the alternating current to the grid-tied point 13 in the power supply system 10. The grid-tied point 13 outputs, to a power grid, the alternating current output by each inverter.

Figures 2, 3:
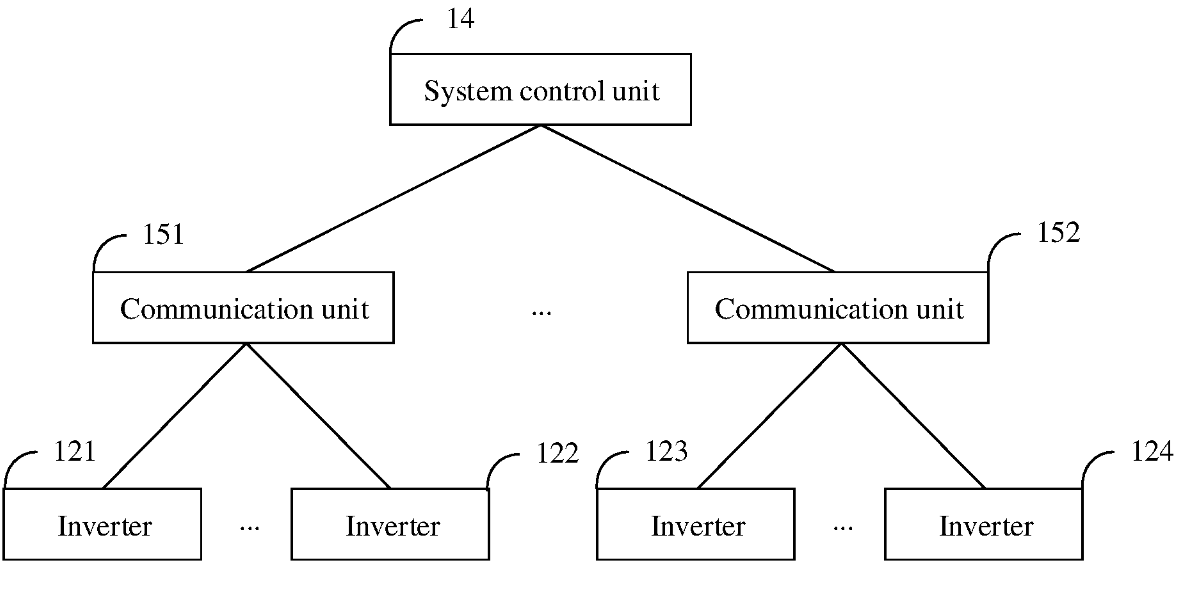
FIG. 2 is a schematic diagram of a communication structure of a power supply system according to the embodiments.
FIG. 3 is a schematic diagram of an output voltage curve of a string during IV curve scanning according to the embodiments.

Further, FIG. 2 is a schematic diagram of a communication structure of a power supply system according to the embodiments. As shown in FIG. 2, the power supply system 10 further includes a system control unit 14 and a plurality of communication units (a communication unit 151, . . . , and a communication unit 152). The system control unit 14 is configured to communicate with each inverter by using at least one communication unit. For example, the system control unit 14 communicates with a plurality of inverters (the inverter 121, . . . , and the inverter 12*n*) by using the communication unit 151. The communication unit may be a wireless communication unit (for example, Wi-Fi, LoRa, or Zigbee) or a PLC communication unit. This is not limited herein. Optionally, the system control unit and the communication unit each may be an independent device, or may be integrated into another device in the power supply system. For example, the system control unit and the communication unit each are integrated into one of the inverters.

The following describes a specific implementation in which the power supply system performs IV curve scanning on the string.

In some implementations, the system control unit correspondingly sends an IV curve scanning instruction of each of the at least two inverters to the inverter by using the communication unit. For example, it is assumed that the power supply system has two inverters in total, such as a first inverter and a second inverter (corresponding to any two inverters in the inverter 121, . . . , and the inverter 12*n* shown in FIG. 1). In this case, the system control unit sends a first IV curve scanning instruction to the first inverter, and sends a second IV curve scanning instruction to the second inverter. After each inverter receives the IV curve scanning instruction of the inverter, the inverter determines a delay duration of the inverter based on a scanning parameter carried in the IV curve scanning instruction of the inverter; determines an IV curve scanning start time of the inverter based on a moment at which the IV curve scanning instruction is received and the delay duration of the inverter; and starts, at the IV curve scanning start time of the inverter, to perform IV curve scanning on at least one string connected to the inverter. The IV curve scanning start times of the inverters are different. In addition, a time interval between IV curve scanning start times of any two inverters in the at least two inverters is less than a preset IV curve scanning period.

In an optional embodiment, the scanning parameter includes a quantity (such as a total quantity of inverters included in the power supply system) of the at least two inverters, the preset IV curve scanning period T, and ranking of a corresponding inverter in all the inverters.

The system control unit correspondingly sends the IV curve scanning instruction to each inverter. The IV curve scanning instruction carries the total quantity of inverters included in the power supply system, the preset IV curve scanning period T, and the ranking of the corresponding inverter in all the inverters. Each inverter receives the IV curve scanning instruction of the inverter, and determines, based on the total quantity N of inverters included in the power supply system, the preset IV curve scanning period T, and the ranking n of the inverter in all the inverters, that the delay duration of the inverter is $T/N*(n-1)$. The delay duration of the inverter is a delay duration from the moment at which the inverter receives the IV curve scanning instruction to the IV curve scanning start time of the inverter.

For example, it is assumed that the power supply system includes an inverter A, an inverter B, an inverter C, and an inverter D in total, the preset IV curve scanning period T is equal to 2 s, and ranking of the inverter A, the inverter B, the inverter C, and the inverter D in the four inverters is respectively 4, 3, 2, and 1. In this case, the inverter A, the inverter B, the inverter C, and the inverter D may obtain respective delay durations 1.5 s, 1 s, 0.5 s, and 0 through calculation.

Then, each inverter may determine the IV curve scanning start time of the inverter based on the moment at which the inverter receives the IV curve scanning instruction and the delay duration of the inverter.

In an implementation, each inverter determines, based on the moment t1 at which the IV curve scanning instruction is received, the delay duration Δt1 of the inverter, and a duration Δt2 used to calculate the delay duration, that the IV curve scanning start time of the inverter is t1+Δt1+Δt2. Because the moments at which the inverters receive the IV curve scanning instruction are the same, and the durations used by the inverters to calculate respective delay durations are the same, a time interval between IV curve scanning start times of any two inverters is a time difference between delay durations of the two inverters. For example, if the delay duration of the first inverter is $T/N*(n_1-1)$, and the delay duration of the second inverter is $T/N*(n_2-1)$, a time interval between the IV curve scanning start time of the first inverter and the IV curve scanning start time of the second inverter is $T/N*|n_1-n_2|$, where $n_1$ is ranking of the first inverter in all the inverters, and $n_2$ is ranking of the second inverter in all the inverters.

It may be understood that, each inverter may obtain the delay duration of the inverter through calculation based on $T/N*(n-1)$, to learn that a time interval between IV curve scanning start times of any two inverters whose ranking is adjacent to each other in all the inverters is T/N. Therefore, it can be ensured that phases of string voltage curves of the inverters during IV curve scanning are evenly staggered, and phases of output power curves of the inverters are evenly staggered, thereby ensuring that an output power of the power supply system is constant.

Then, each inverter starts, at the IV curve scanning start time of the inverter, to perform IV curve scanning on at least one string connected to the inverter.

In an implementation, when the inverter is connected to a plurality of strings, the inverter starts, at the IV curve scanning start time of the inverter based on a preset scanning sequence (for example, ranking of a string in a sequence of ranking of all the strings connected to the inverter), to sequentially perform IV curve scanning on the strings connected to the inverter.

For example, when the inverter A is connected to a string 1, a string 2, and a string 3, the inverter A first performs IV curve scanning on the string 1 in ascending order of string sequence numbers at an IV curve scanning start time of the inverter A, starts to perform IV curve scanning on the string 2 when scanning on the string 1 ends, and starts to perform IV curve scanning on the string 3 when scanning on the string 2 ends.

It may be understood that, when the inverter is connected to a plurality of strings, the inverter may perform IV curve scanning on each string, connected to the inverter, in a manner in which the inverter starts, at a moment of completing IV curve scanning on one string connected to the inverter, to perform IV curve scanning on another string connected to the inverter. In this manner, in a process in which the inverter performs IV curve scanning on each string connected to the inverter, the inverter has at least one string in a normal state, thereby ensuring that the inverter still has a specific output power in the IV curve scanning process, and reducing fluctuation of an output power of the power supply system.

In another implementation, when the inverter is connected to a plurality of strings, the inverter may start, at the IV curve scanning start time of the inverter, to simultaneously perform IV curve scanning on the plurality of strings connected to the inverter.

It may be understood that, when there are a plurality of strings connected to the inverter, the inverter may complete, based on a preset scanning order in a manner of starting to perform IV curve scanning on another string when scanning on one string is completed, that is, in a serial manner, or in a manner of simultaneously performing IV curve scanning on the plurality of strings connected to the inverter, that is, in a parallel manner, scanning on the strings connected to the inverter. Because neither of the foregoing two IV curve scanning manners affects the IV curve scanning start time of the inverter, fluctuation of an output power of the power supply system in the IV curve scanning process can be reduced. However, due to a superposition effect of output voltages of the strings connected to the inverter, fluctuation of an output power of the inverter in the parallel manner is greater than fluctuation of an output power of the inverter in the serial manner, and therefore fluctuation of the output power of the power supply system in the parallel manner is greater than fluctuation of the output power of the power supply system in the serial manner.

The following describes an implementation process in which the inverter performs IV curve scanning on a string (for example, a first string) connected to the inverter.

In an implementation, the inverter starts, at the IV curve scanning start time of the inverter, to control a switching transistor of the inverter to ensure that the inverter is turned off, so that the first string is open-circuited, that is, an output voltage of the first string is an open-circuit voltage; adjusts a turn-on or turn-off duration of the switching transistor of the inverter based on a preset fall rule, so that the output voltage of the first string falls from the open-circuit voltage to 0; adjusts the turn-on or turn-off duration of the switching transistor of the inverter based on a preset rise rule, so that the output voltage of the first string rises from 0 to the open-circuit voltage; and records the change into scanning data of the first string in a preset IV curve scanning period.

The preset IV curve scanning period includes a fall phase scanning period and a rise phase scanning period. The fall phase scanning period is a corresponding time period in which the inverter adjusts the turn-on or turn-off duration of the switching transistor of the inverter based on the preset fall rule, so that the output voltage of the first string falls from the open-circuit voltage to 0. The rise phase scanning period is a corresponding time period in which the inverter adjusts the turn-on or turn-off duration of the switching transistor of the inverter based on the preset rise rule, so that the output voltage of the first string rises from 0 to the open-circuit voltage.

The preset fall rule may be at least one of a voltage fall rule with a fixed voltage difference, a parabolic voltage fall rule, or a voltage fall rule with a fixed duty cycle change rate. The parabolic voltage fall rule may be that a voltage falls quickly near the output voltage that is of the first string and that is the open-circuit voltage, and the voltage falls slowly near the output voltage that is of the first string and that is 0. Alternatively, the parabolic voltage fall rule may be that a voltage falls slowly near the output voltage that is of the first string and that is the open-circuit voltage, and the voltage falls quickly near the output voltage that is of the first string and that is 0. The voltage fall rule with a fixed duty cycle change rate may be that a control duty cycle of the inverter changes from an initial value at a fixed step. For example, the control duty cycle of the inverter starts from 0, and increases to 1 at a fixed step 0.01.

In addition, the preset fall rule is totally opposite to the preset rise rule. For example, FIG. 3 is a schematic diagram of an output voltage curve of a string during IV curve scanning according to the embodiments. As shown in FIG. 3, the left part of the figure is a schematic diagram of output voltage curves of a string that correspond to a case in which the preset fall rule is a voltage fall rule with a fixed voltage difference a and a case in which the preset rise rule is a voltage rise rule with a fixed voltage difference −a. The right part of the figure is a schematic diagram of an output voltage curve of a string that meets the following parabolic rule: In a fall phase scanning period, a voltage falls quickly near an output voltage that is of the string and that is an open-circuit voltage, and the voltage falls slowly near an output voltage that is of the string and that is 0; and in a rise phase scanning period, a voltage rises slowly near an output voltage that is of the string and that is 0, and the voltage rises quickly near an output voltage that is of the string and that is an open-circuit voltage. When the preset fall rule is a parabolic voltage fall rule, the output voltage of the string is $V_{out}=b[t-(T/2+t_1)]^2$, and $t_1 \le t \le (T/2+t_1)$. When the preset rise rule is a parabolic voltage rise rule, $V_{out}=b[t-(T/2+t_1)]^2$, $T/2+t_1 < t \le T+t_1$, and $b=4V_{oc}/T^2$, where $V_{oc}$ is the open-circuit voltage of the string, T is the preset IV curve scanning period, and $t_1$ is the IV curve scanning start time of the string.

Figure 4:
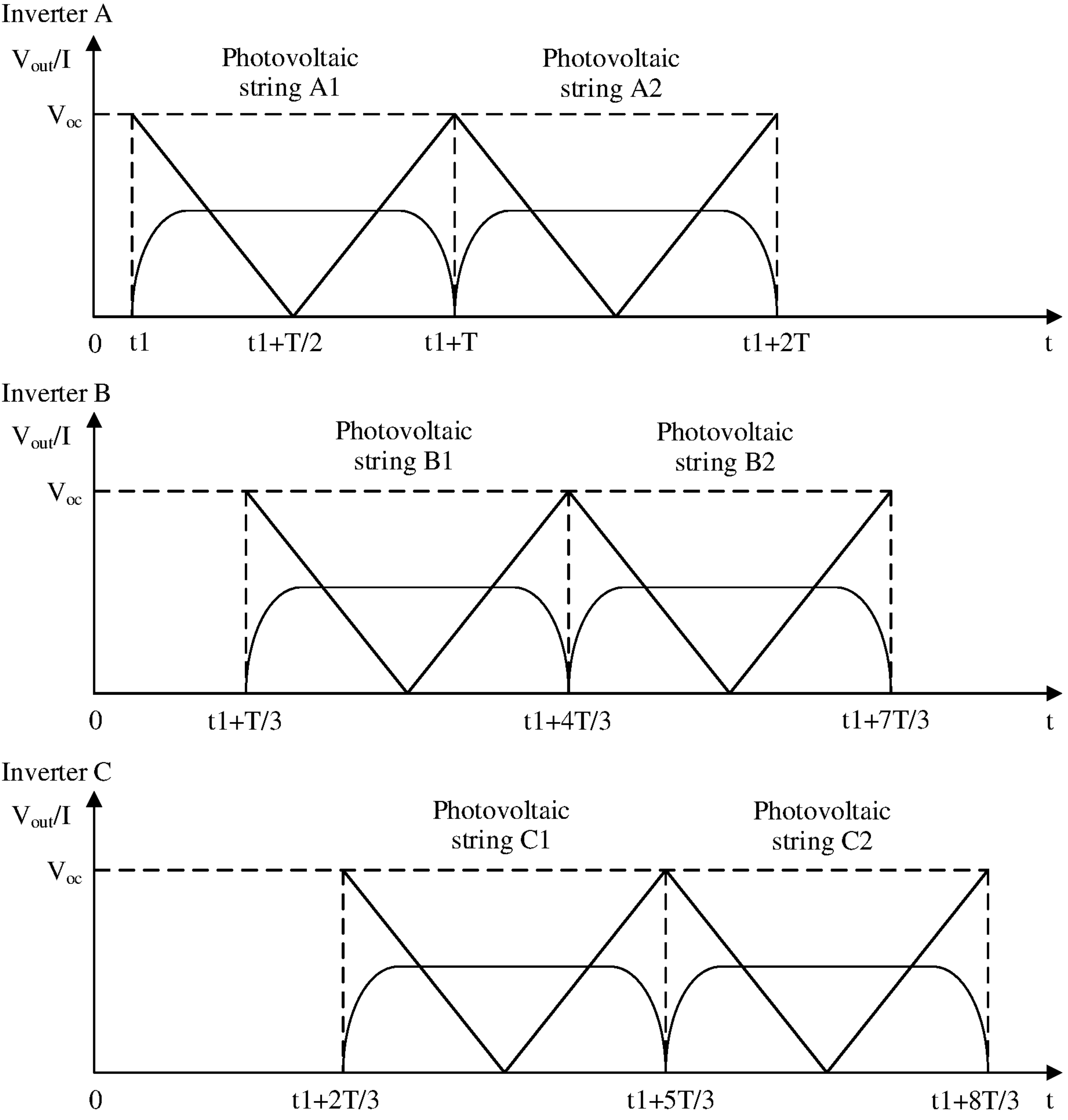
FIG. 4 is a schematic diagram of performing, in a serial manner when a plurality of inverters are all connected to a plurality of photovoltaic strings, IV curve scanning on the photovoltaic strings connected to the plurality of inverters according to the embodiments.

For ease of understanding, for example, FIG. 4 is a schematic diagram of performing, in a serial manner when a plurality of inverters are all connected to a plurality of photovoltaic strings, IV curve scanning on the photovoltaic strings connected to the plurality of inverters according to the embodiments. As shown in FIG. 4, the figure shows the following process: the power supply system includes three inverters in total: an inverter A, an inverter B, and an inverter C, and when a quantity of photovoltaic strings connected to each inverter is 2, the three inverters each perform, in a serial manner, IV curve scanning on the photovoltaic strings connected to the inverters. IV curve scanning start times of the inverter A, the inverter B, and the inverter C are respectively $t_1$, $t_1+T/3$, and $t_1+2T/3$. The following uses the inverter A as an example to describe a process of performing IV curve scanning on a photovoltaic string A1 and a photovoltaic string A2 connected to the inverter A. It is assumed that ranking of the photovoltaic string A1 in the photovoltaic string A1 and the photovoltaic string A2 is greater than ranking of the photovoltaic string A2 in the photovoltaic string A1 and the photovoltaic string A2. The inverter A starts, at the moment $t_1$, to adjust an output voltage (a broken line at the photovoltaic string A1 in FIG. 4) of the photovoltaic string A1 first based on a voltage fall rule with a fixed voltage difference a and then based on a voltage rise rule with a fixed voltage difference −a. In addition, the inverter A records an output current (a curve at the photovoltaic string A1 in FIG. 4) that is of the photovoltaic string A1 and that changes with the voltage. When completing scanning on the photovoltaic string A1, that is, at a moment $t_1+T$, the inverter A starts to perform IV curve scanning on the photovoltaic string A2, and completes, at the moment $t_1+2T$, scanning on all the photovoltaic strings connected to the inverter A, where $t_1$ is a moment at which each inverter receives an IV curve scanning instruction, and T is a preset IV curve scanning period.

Figure 5:
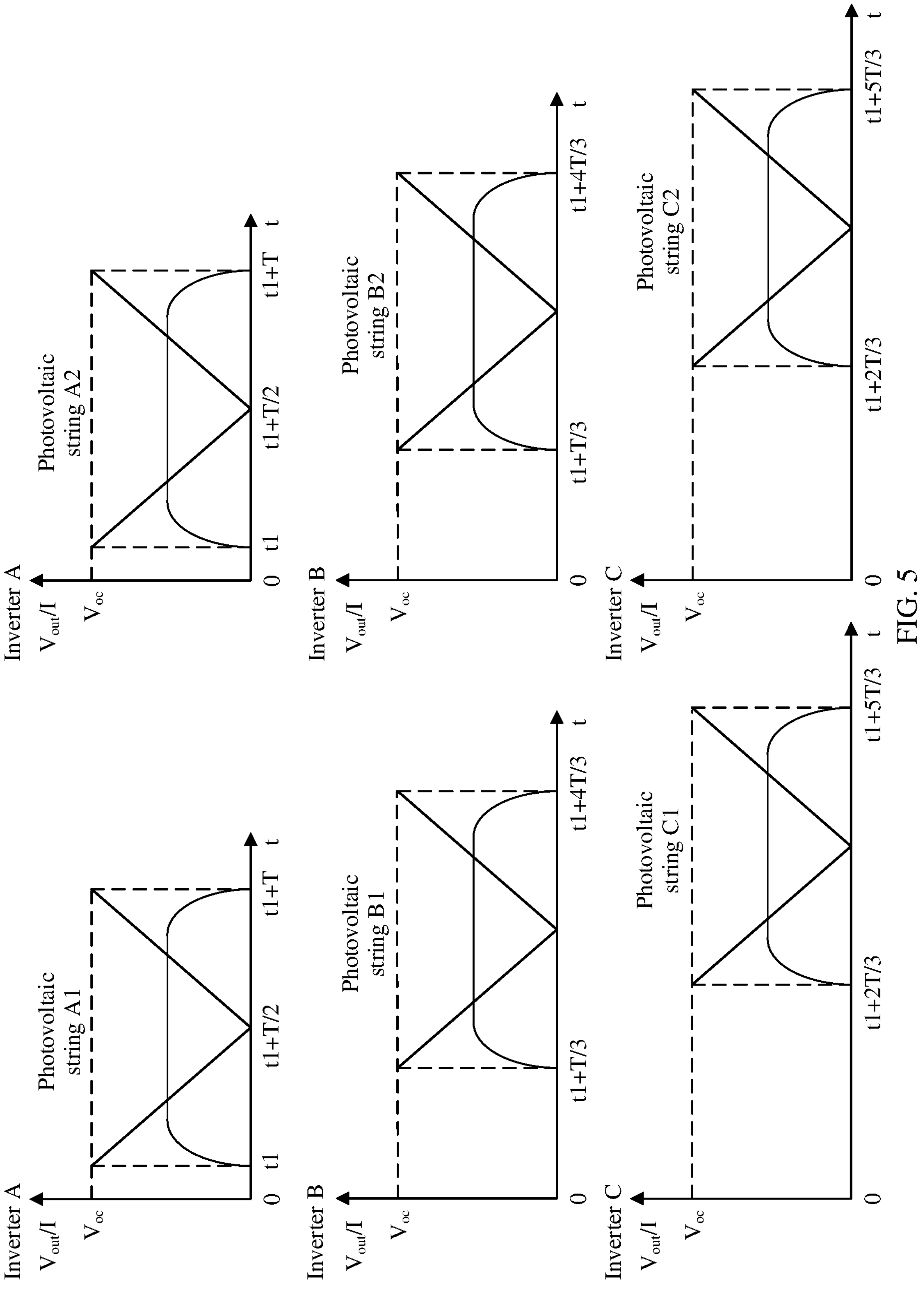
FIG. 5 is a schematic diagram of performing, in a parallel manner when a plurality of inverters are all connected to a plurality of photovoltaic strings, IV curve scanning on the photovoltaic strings connected to the plurality of inverters according to the embodiments.

For example, FIG. 5 is a schematic diagram of performing, in a parallel manner when a plurality of inverters are all connected to a plurality of photovoltaic strings, IV curve scanning on the photovoltaic strings connected to the plurality of inverters according to the embodiments. As shown in FIG. 5, the figure shows the following process: the power supply system includes three inverters in total: an inverter A, an inverter B, and an inverter C, and when a quantity of photovoltaic strings connected to each inverter is 2, the three inverters each perform, in a parallel manner, IV curve scanning on the photovoltaic strings connected to the inverters. IV curve scanning start times of the inverter A, the inverter B, and the inverter C are respectively $t_1$, $t_1+T/3$, and $t_1+2T/3$. The following uses the inverter A as an example to describe a process of performing IV curve scanning on a photovoltaic string A1 and a photovoltaic string A2 connected to the inverter A. The inverter A starts, at the moment $t_1$, to simultaneously adjust output voltages (broken lines at the photovoltaic string A1 and the photovoltaic string A2 in FIG. 5) of the photovoltaic string A1 and the photovoltaic string A2 first based on a voltage fall rule with a fixed voltage difference a and then based on a voltage rise rule with a fixed voltage difference −a. In addition, the inverter A records output currents (curves at the photovoltaic string A1 and the photovoltaic string A2 in FIG. 5) that are of the photovoltaic string A1 and the photovoltaic string A2 and that change with the voltage. In addition, the inverter A simultaneously completes, at a moment $t_1+T$, scanning on the photovoltaic string A1 and the photovoltaic string A2, where $t_1$ is a moment at which each inverter receives an IV curve scanning instruction, and T is a preset IV curve scanning period.

After completing IV curve scanning on the string connected to the inverter, the inverter compares fall phase scanning data of the string in the fall phase scanning period with rise phase scanning data of the string in the rise phase scanning period, and outputs an IV curve scanning result of the string based on a comparison result. Both the fall phase scanning data and the rise phase scanning data include an output voltage value v and an output current value i of the string.

In an implementation, the inverter obtains K pieces of fall phase scanning data $P_{11}(v_{11}, i_{11})$, $P_{12}(v_{12}, i_{12})$, . . . , $P_{1K}(v_{1K}, i_{1K})$ from the fall phase scanning data of the string; obtains, from the rise phase scanning data of the string, K pieces of rise phase scanning data $P_{21}(v_{21}, i_{21})$, $P_{22}(v_{22}, i_{22})$, . . . , $P_{2K}(v_{2K}, i_{2K})$ that respectively correspond to output voltage values in the K pieces of fall phase scanning data; and calculates a correlation coefficient between the two groups of data $I_1=(i_{11}, i_{12}, \ldots, i_{1K})$ and $I_2=(i_{21}, i_{22}, \ldots, i_{2K})$, where K is a positive integer, and is generally 32. If the correlation coefficient between the two groups of data is greater than or equal to a preset correlation coefficient threshold, the inverter draws an IV curve of the string based on the K pieces of fall phase scanning data, and sends the IV curve of the string to the system control unit by using the communication unit. If the correlation coefficient between the two groups of data is less than a preset correlation coefficient threshold, the inverter sends a string IV curve scanning failure message to the system control unit by using the communication unit.

It may be understood that, if the correlation coefficient between the two groups of data is greater than or equal to the preset correlation coefficient threshold, it indicates that obtained scanned data of the string in the preset IV curve scanning period is valid; or if the correlation coefficient between the two groups of data is less than the preset correlation coefficient threshold, it indicates that obtained scanned data of the string in the preset IV curve scanning period is inaccurate. Therefore, the IV curve scanning result of the string is determined by comparing the fall phase scanning data with the rise phase scanning data, so that accuracy of the IV curve scanning result of the string can be effectively improved. For the photovoltaic string, the foregoing manner can effectively resolve a problem that accuracy of an IV curve scanning result of the photovoltaic string is low due to a lighting change in an IV curve scanning process.

In this embodiment, each inverter may determine, based on the total quantity N of inverters included in the power supply system, the preset IV curve scanning period T, and the ranking n of the inverter in all the inverters that are carried in the IV curve scanning instruction, that the delay duration of the inverter is $T/N*(n-1)$; determine the IV curve scanning start time of the inverter based on the moment at which the IV curve scanning instruction is received and the delay duration; and start, at the IV curve scanning start time of the inverter, to perform IV curve scanning on the string connected to the inverter. The IV curve scanning start times of the inverters are different, and a time interval between IV curve scanning start times of any two inverters whose ranking is adjacent to each other in the at least two inverters is T/N. Therefore, during IV curve scanning, it can be ensured that phases of string voltage curves of the inverters are staggered, and phases of string output power curves of the inverters are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

In another optional embodiment, the scanning parameter includes a delay duration of a corresponding inverter.

In some implementations, the system control unit may separately determine, as delay durations of inverters in N inverters based on the preset IV curve scanning period T and the total quantity N of inverters included in the power supply system, N durations that are different and that are less than T.

For example, it is assumed that the power supply system includes an inverter A, an inverter B, an inverter C, and an inverter D in total, and the preset IV curve scanning period T is equal to 2 s. In this case, the system control unit determines that delay durations of the inverter A, the inverter B, the inverter C, and the inverter D may be respectively 0, 0.4 s, 1 s, and 1.5 s or may be respectively 0, 0.2 s, 0.8 s, and 1.8 s.

Further, the system control unit may further determine, based on T, the total quantity N of inverters included in the power supply system, and the ranking n of each inverter in all the inverters, that the delay duration of each inverter is $T/N^*(n-1)$.

Then, the system control unit correspondingly sends the IV curve scanning instruction of each inverter to the inverter by using the communication unit. Each inverter receives the IV curve scanning instruction of the inverter, and determines, based on the delay duration $\Delta t1$ that is of the inverter and that is carried in the IV curve scanning instruction of the inverter and the moment $t1$ at which the IV curve scanning instruction is received, that the IV curve scanning start time of the inverter is $t1+\Delta t1$.

It can be understood that, because the moments at which the inverters receive the IV curve scanning instruction are the same, a time interval between IV curve scanning start times of any two inverters is a time difference between delay durations of the two inverters. In addition, because the delay durations of the inverters are different and are less than the preset IV curve scanning period, the IV curve scanning start times of the inverters are different, and a time interval between IV curve scanning start times of any two inverters in the at least two inverters is less than the preset IV curve scanning period. In this way, the IV curve scanning start times of the inverters may be distributed in a staggered manner in one preset IV curve scanning period. Therefore, during IV curve scanning, it is ensured that phases of string voltage curves of the inverters are staggered, and phases of output power curves of the inverters are staggered, thereby reducing fluctuation of an output power of the power supply system, and having high applicability. Further, if the delay duration of each inverter is $T/N^*(n-1)$, it can be ensured that phases of string voltage curves of the inverters during IV curve scanning are evenly staggered, and phases of output power curves of the inverters are evenly staggered, so that the output power of the power supply system is constant, and applicability is higher.

Then, each inverter starts, at the IV curve scanning start time of the inverter, to perform IV curve scanning on at least one string connected to the inverter. After completing IV curve scanning on the string connected to the inverter, the inverter compares fall phase scanning data of the string in the fall phase scanning period with rise phase scanning data of the string in the rise phase scanning period, and outputs an IV curve scanning result of the string based on a comparison result.

Herein, for a specific implementation process in which each inverter performs IV curve scanning on the string connected to the inverter and outputs, based on the scanning data in the preset IV curve scanning period, the IV curve scanning result of the string connected to the inverter, refer to the descriptions of the corresponding part in the foregoing embodiment. Details are not described herein again.

In this embodiment, after determining the delay duration of each inverter, the system control unit may correspondingly send the IV curve scanning instruction to the inverter. Each inverter determines, as the delay duration $\Delta t1$ of the inverter, the delay duration that is of the inverter and that is carried in the IV curve scanning instruction received by the inverter; determines, based on the delay duration $\Delta t1$ of the inverter and the moment $t1$ at which the IV curve scanning instruction is received, that the IV curve scanning start time of the inverter is $t1+\Delta t1$; and starts, at the IV curve scanning start time of the inverter, to perform IV curve scanning on the string connected to the inverter. The IV curve scanning start times of the inverters are different, and a time interval between IV curve scanning start times of any two inverters in the at least two inverters is less than the preset IV curve scanning period. In this way, it is ensured that the IV curve scanning start times of the inverters are distributed in a staggered manner in one preset IV curve scanning period. Therefore, in an IV curve scanning process, phases of string voltage curves of the inverters are staggered, and phases of string output power curves of the inverters are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

In some other implementations, the system control unit correspondingly sends the IV curve scanning instruction to each inverter by using the communication unit. After each inverter receives the IV curve scanning instruction of the inverter, the inverter determines a delay duration of the inverter based on a preset configuration parameter of the inverter; determines an IV curve scanning start time of the inverter based on a moment at which the IV curve scanning instruction is received and the delay duration of the inverter; and starts, at the IV curve scanning start time of the inverter, to perform IV curve scanning on at least one string connected to the inverter. The IV curve scanning start times of the inverters are different. In addition, a time interval between IV curve scanning start times of any two inverters in the at least two inverters is less than the preset IV curve scanning period.

In an optional embodiment, the preset configuration parameter includes a quantity (such as a total quantity of inverters included in the power supply system) of the at least two inverters, the preset IV curve scanning period T, and ranking of a corresponding inverter in all the inverters.

After receiving the IV curve scanning instruction sent by the system control unit, each inverter determines, based on the total quantity N of inverters included in the power supply system, the preset IV curve scanning period T, and the ranking n of the inverter in all the inverters, that the delay duration of the inverter is $T/N^*(n-1)$, and determines, based on the moment $t1$ at which the IV curve scanning instruction is received, the delay duration $\Delta t1$ of the inverter, and a duration $\Delta t2$ used to calculate the delay duration, that the IV curve scanning start time of the inverter is $t1+\Delta t1+\Delta t2$.

Because the moments at which the inverters receive the IV curve scanning instruction are the same, and the durations used by the inverters to calculate respective delay durations are the same, a time interval between IV curve scanning start times of any two inverters is a time difference between delay durations of the two inverters. For example, if the delay duration of the first inverter is $T/N*(n_1-1)$, and the delay duration of the second inverter is $T/N*(n_2-1)$, a time interval between the IV curve scanning start time of the first inverter and the IV curve scanning start time of the second inverter is $T/N*|n_1-n_2|$, where $n_1$ is ranking of the first inverter in all the inverters, and $n_2$ is ranking of the second inverter in all the inverters.

It may be understood that, each inverter may obtain the delay duration of the inverter through calculation based on $T/N*(n-1)$, to learn that a time interval between IV curve scanning start times of any two inverters whose ranking is adjacent to each other in all the inverters is T/N. Therefore, it can be ensured that phases of string voltage curves of the inverters during IV curve scanning are evenly staggered, and phases of output power curves of the inverters are evenly staggered, thereby ensuring that an output power of the power supply system is constant.

Then, each inverter starts, at the IV curve scanning start time of the inverter, to perform IV curve scanning on at least one string connected to the inverter. After completing IV curve scanning on the string connected to the inverter, the inverter compares fall phase scanning data of the string in the fall phase scanning period with rise phase scanning data of the string in the rise phase scanning period, and outputs an IV curve scanning result of the string based on a comparison result.

Herein, for a specific implementation process in which each inverter performs IV curve scanning on the string connected to the inverter and outputs, based on the scanning data in the preset IV curve scanning period, the IV curve scanning result of the string connected to the inverter, refer to the descriptions of the corresponding part in the first embodiment. Details are not described herein again.

In this embodiment, after each inverter receives the IV curve scanning instruction sent by the system control unit, the inverter may determine, based on the preset configuration parameter of the inverter, that the delay duration of the inverter is $T/N*(n-1)$; determine the IV curve scanning start time of the inverter based on the moment at which the IV curve scanning instruction is received and the delay duration; and start, at the IV curve scanning start time of the inverter, to perform IV curve scanning on the string connected to the inverter. The IV curve scanning start times of the inverters are different, and a time interval between IV curve scanning start times of any two inverters whose ranking is adjacent to each other in the at least two inverters is T/N. Therefore, in an IV curve scanning process, phases of string voltage curves of the inverters are staggered, and phases of string output power curves of the inverters are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

FIG. 6 is a schematic flowchart of an IV curve scanning method for a power supply system according to the embodiments. The IV curve scanning method for a power supply system provided in this embodiment is applicable to the power supply system shown in FIG. 1 and FIG. 2. The IV curve scanning method for a power supply system may include the following steps.

S101: A first inverter performs, at an IV curve scanning start time of the first inverter, IV curve scanning on at least one string connected to the first inverter.

The IV curve scanning start time of the first inverter is determined based on a moment at which a first IV curve scanning instruction is received and a delay duration of the first inverter.

In some implementations, before performing step S101, the first inverter receives the first IV curve scanning instruction sent by a system control unit, and determines the IV curve scanning start time of the first inverter based on the moment at which the first IV curve scanning instruction is received and the delay duration of the first inverter.

In some implementations, the first inverter determines the delay duration of the first inverter based on a scanning parameter carried in the first IV curve scanning instruction.

In an optional embodiment, the scanning parameter includes the delay duration of the first inverter, and the first inverter determines, as the delay duration of the first inverter, a delay duration that is of the first inverter and that is carried in the first IV curve scanning instruction. The delay duration of the first inverter may be determined by the system control unit based on a preset IV curve scanning period T, and delay durations of inverters in at least two inverters are different and are less than T. Alternatively, the delay duration of the first inverter may be determined by the system control unit based on a total quantity N of inverters included in the power supply system, a preset IV curve scanning period T, and ranking $n_1$ of the first inverter in all the inverters, and the delay duration of the first inverter is $T/N*(n_1-1)$.

In another optional embodiment, the scanning parameter includes a total quantity N of inverters included in the power supply system, a preset IV curve scanning period T, and ranking $n_1$ of the first inverter in all the inverters. The first inverter may determine, based on the total quantity N of inverters included in the power supply system, the preset IV curve scanning period T, and the ranking $n_1$ of the first inverter in all the inverters, that the delay duration of the first inverter is $T/N*(n_1-1)$.

In some other implementations, after receiving the first IV curve scanning instruction, the first inverter determines the delay duration of the first inverter based on a preset configuration parameter of the first inverter.

In an optional embodiment, the preset configuration parameter of the first inverter includes a total quantity N of inverters included in the power supply system, a preset IV curve scanning period T, and ranking $n_1$ of the first inverter in all the inverters. The first inverter may determine, based on the total quantity N of inverters included in the power supply system, the preset IV curve scanning period T, and the ranking $n_1$ of the first inverter in all the inverters, that the delay duration of the first inverter is $T/N*(n_1-1)$.

Then, the first inverter determines, based on the moment $t_{11}$ at which the first IV curve scanning instruction is received, the delay duration $\Delta t_{21}$ of the first inverter, and a duration $\Delta t_{31}$ used to calculate the delay duration, that the IV curve scanning start time of the first inverter is $t_{11}+\Delta t_{21}+\Delta t_{31}$. When the scanning parameter includes the delay duration of the first inverter, $\Delta t_{31}=0$.

Subsequently, the first inverter performs, at the IV curve scanning start time of the first inverter, IV curve scanning on the at least one string connected to the first inverter.

The at least one string connected to the first inverter may be a photovoltaic string, or may be an energy storage battery string.

In some implementations, the first inverter starts, at the IV curve scanning start time of the first inverter, to perform IV curve scanning on the at least one string connected to the first inverter. After completing IV curve scanning on the string connected to the first inverter, the first inverter compares fall phase scanning data of the string in a fall phase scanning period with rise phase scanning data of the string in a rise phase scanning period, and outputs an IV curve scanning result of the string based on a comparison result. In this manner, accuracy of the IV curve scanning result of the string can be effectively improved.

S102: A second inverter starts, at an IV curve scanning start time of the second inverter, to perform IV curve scanning on at least one string connected to the second inverter.

The IV curve scanning start time of the second inverter is determined based on a moment at which a second IV curve scanning instruction is received and a delay duration of the second inverter. The IV curve scanning start time of the first inverter and the IV curve scanning start time of the second inverter are different. In addition, a time interval between the IV curve scanning start time of the first inverter and the IV curve scanning start time of the second inverter is less than the preset IV curve scanning period. In addition, the first inverter and the second inverter correspond to any two inverters in the inverter 121, . . . , and the inverter **12*n* shown in FIG. 1**.

In some implementations, before performing step S102, the second inverter receives the second IV curve scanning instruction sent by the system control unit, and determines the IV curve scanning start time of the second inverter based on the moment at which the second IV curve scanning instruction is received and the delay duration of the second inverter.

In some implementations, the second inverter determines the delay duration of the second inverter based on a scanning parameter carried in the second IV curve scanning instruction.

In an optional embodiment, the scanning parameter includes the delay duration of the second inverter, and the second inverter determines, as the delay duration of the second inverter, a delay duration that is of the second inverter and that is carried in the second IV curve scanning instruction. The delay duration of the second inverter may be determined by the system control unit based on the preset IV curve scanning period T, and delay durations of inverters in at least two inverters are different and are less than T. Alternatively, the delay duration of the second inverter may be determined by the system control unit based on a total quantity N of inverters included in the power supply system, the preset IV curve scanning period T, and ranking $n_2$ of the second inverter in all the inverters, and the delay duration of the second inverter is $T/N*(n_2-1)$.

In another optional embodiment, the scanning parameter includes a total quantity N of inverters included in the power supply system, the preset IV curve scanning period T, and ranking $n_2$ of the second inverter in all the inverters. The second inverter may determine, based on the total quantity N of inverters included in the power supply system, the preset IV curve scanning period T, and the ranking $n_2$ of the second inverter in all the inverters, that the delay duration of the second inverter is $T/N*(n_2-1)$.

In some other implementations, after receiving the second IV curve scanning instruction, the second inverter determines the delay duration of the second inverter based on a preset configuration parameter of the second inverter.

In an optional embodiment, the preset configuration parameter of the second inverter includes a total quantity N of inverters included in the power supply system, the preset IV curve scanning period T, and ranking $n_2$ of the second inverter in all the inverters. The second inverter may determine, based on the total quantity N of inverters included in the power supply system, the preset IV curve scanning period T, and the ranking $n_2$ of the second inverter in all the inverters, that the delay duration of the second inverter is $T/N*(n_2-1)$.

Then, the second inverter determines, based on the moment $t_{12}$ at which the second IV curve scanning instruction is received, the delay duration $\Delta t_{22}$ of the second inverter, and a duration $\Delta t_{32}$ used to calculate the delay duration, that the IV curve scanning start time of the second inverter is $t_{12}+\Delta t_{22}+\Delta t_{32}$. When the scanning parameter includes the delay duration of the second inverter, $\Delta t_{32}=0$.

Subsequently, the second inverter performs, at the IV curve scanning start time of the second inverter, IV curve scanning on the at least one string connected to the second inverter.

The at least one string connected to the second inverter may be a photovoltaic string, or may be an energy storage battery string.

In some implementations, the second inverter starts, at the IV curve scanning start time of the second inverter, to perform IV curve scanning on the at least one string connected to the second inverter. After completing IV curve scanning on the string connected to the second inverter, the second inverter compares fall phase scanning data of the string in a fall phase scanning period with rise phase scanning data of the string in a rise phase scanning period, and outputs an IV curve scanning result of the string based on a comparison result. In this manner, accuracy of the IV curve scanning result of the string can be effectively improved.

It may be understood that, because $t_{11}$ is the same as $t_{12}$, and $\Delta t_{21}$ is equal to $\Delta t_{22}$, the delay duration of the first inverter and the delay duration of the second inverter are different, and are both less than the preset IV curve scanning period. Therefore, the IV curve scanning start time of the first inverter and the IV curve scanning start time of the second inverter are different, and the time interval between the IV curve scanning start time of the first inverter and the IV curve scanning start time of the second inverter is less than the preset IV curve scanning period. Therefore, it can be ensured that in an IV curve scanning process, phases of a string voltage curve of the first inverter and a string voltage curve of the second inverter are staggered, and phases of a string output power curve of the first inverter and a string output power curve of the second inverter are staggered, thereby reducing fluctuation of an output power of the power supply system, and having high applicability. Further, when the delay duration of the first inverter is $T/N*(n_1-1)$ and the delay duration of the second inverter is $T/N*(n_2-1)$, in the IV curve scanning process, the phases of the string voltage curve of the first inverter and the string voltage curve of the second inverter can be staggered, and the phases of the string output power curve of the first inverter and the string output power curve of the second inverter can be staggered, so that the output power of the power supply system is more constant, and applicability is higher.

In the embodiments, in the power supply system, the delay durations of the inverters are different and are less than the preset IV curve scanning period. In this way, it can be ensured that the IV curve scanning start times of the inverters are distributed in a staggered manner in one preset IV curve scanning period. Therefore, in an IV curve scanning process, phases of string voltage curves of the inverters are staggered, and phases of string output power curves of the inverters are staggered, thereby reducing fluctuation of an output power of the power supply system. In this way, the output power of the power supply system meets a preset output power fluctuation range, so that system stability of the power supply system in the IV curve scanning process is improved to a maximum extent, and applicability is high.

The foregoing descriptions are merely implementations of the embodiments, but are not intended as limiting. Any variation or replacement readily figured out by a person skilled in the art shall fall within the scope of the embodiments.

What is claimed is:

1. A power supply system, comprising:

at least two inverters, each of which is configured to connect to at least one photovoltaic string, and the at least two inverters comprise:

a first inverter configured to start, at a current-voltage (IV) curve scanning start time of the first inverter, to perform IV curve scanning on at least one photovoltaic string connected to the first inverter, wherein the IV curve scanning start time of the first inverter is determined based on a moment at which a first IV curve scanning instruction is received and a delay duration of the first inverter; and a second inverter, configured to start, at an IV curve scanning start time of the second inverter, to perform IV curve scanning on at least one photovoltaic string connected to the second inverter, wherein the IV curve scanning start time of the second inverter is determined based on a moment at which a second IV curve scanning instruction is received and a delay duration of the second inverter, and the IV curve scanning start time of the first inverter and the IV curve scanning start time of the second inverter are different, and a time interval between the IV curve scanning start time of the first inverter and the IV curve scanning start time of the second inverter is less than a preset IV curve scanning period;

wherein the delay duration of the first inverter is $T/N^*(n_1-1)$, and the delay duration of the second inverter is $T/N^*(n_2-1)$, wherein T is the preset IV curve scanning period, N is the quantity of the at least two inverters, $n_1$ is ranking of the first inverter in the at least two inverters, and $n_2$ is ranking of the second inverter in the at least two inverters.

2. The power supply system according to claim 1, wherein, when the first inverter is connected to a plurality of photovoltaic strings, starting, at the IV curve scanning start time of the first inverter, to perform the IV curve scanning on at least one photovoltaic string connected to the first inverter comprises:

starting, by the first inverter at the IV curve scanning start time of the first inverter based on a preset scanning sequence, to sequentially perform IV curve scanning on the photovoltaic strings connected to the first inverter.

3. The power supply system according to claim 1, wherein the preset IV curve scanning period comprises a fall phase scanning period and a rise phase scanning period, and the at least one photovoltaic string connected to the first inverter comprises a first photovoltaic string; and the first inverter is further configured to:

after starting, at the IV curve scanning start time of the first inverter, to perform the IV curve scanning on at least one photovoltaic string connected to the first inverter, comparing fall phase scanning data of the first photovoltaic string in the fall phase scanning period with rise phase scanning data of the first photovoltaic string in the rise phase scanning period; and outputting an IV curve scanning result of the first photovoltaic string based on a comparison result.

4. The power supply system according to claim 1, wherein the preset IV curve scanning period comprises a fall phase scanning period and a rise phase scanning period, and the at least one photovoltaic string connected to the first inverter comprises a first photovoltaic string; and the first inverter is further configured to:

after starting, at the IV curve scanning start time of the first inverter, to perform the IV curve scanning on at least one photovoltaic string connected to the first inverter, comparing fall phase scanning data of the first photovoltaic string in the fall phase scanning period with rise phase scanning data of the first photovoltaic string in the rise phase scanning period; and outputting an IV curve scanning result of the first photovoltaic string based on a comparison result.

5. The power supply system according to claim 1, further comprising a Ni—Cd battery, a NiMH battery, a lithium-ion battery, or a lithium polymer battery disposed between the inverter and a power grid.

6. The power supply system according to claim 1, wherein a plurality of photovoltaic strings are connected to the first inverter, and the plurality of photovoltaic strings are connected in parallel.

7. The power supply system according to claim 1, wherein a plurality of photovoltaic strings are connected to the first inverter, and the plurality of photovoltaic strings comprise a plurality of photovoltaic modules that are connected in series.

8. A current-voltage (IV) curve scanning method for a power supply system, wherein the power supply system comprises at least two inverters, each of the at least two inverters is configured to connect to at least one photovoltaic string, and the at least two inverters comprise a first inverter and a second inverter; and the method comprises:

starting, by the first inverter at an IV curve scanning start time of the first inverter, to perform IV curve scanning on at least one photovoltaic string connected to the first inverter, wherein the IV curve scanning start time of the first inverter is determined based on a moment at which a first IV curve scanning instruction is received and a delay duration of the first inverter; and starting, by the second inverter at an IV curve scanning start time of the second inverter, to perform IV curve scanning on at least one photovoltaic string connected to the second inverter, wherein the IV curve scanning start time of the second inverter is determined based on a moment at which a second IV curve scanning instruction is received and a delay duration of the second inverter, and the IV curve scanning start time of the first inverter and the IV curve scanning start time of the second inverter are different, and a time interval between the IV curve scanning start time of the first inverter and the IV curve scanning start time of the second inverter is less than a preset IV curve scanning period;

wherein the delay duration of the first inverter is $T/N^*(n_1-1)$, and the delay duration of the second inverter is $T/N^*(n_2-1)$, wherein T is the preset IV curve scanning period, N is the quantity of the at least two inverters, $n_1$ is ranking of the first inverter in the at least two inverters, and $n_2$ is ranking of the second inverter in the at least two inverters.

9. The method according to claim 8, wherein starting, at the IV curve scanning start time of the first inverter, to perform the IV curve scanning on at least one photovoltaic string connected to the first inverter comprises:

when the first inverter is connected to a plurality of photovoltaic strings, starting, by the first inverter at the IV curve scanning start time of the first inverter based on a preset scanning sequence, to sequentially perform IV curve scanning on the photovoltaic strings connected to the first inverter.

10. The method according to claim 8, wherein the preset IV curve scanning period comprises a fall phase scanning period and a rise phase scanning period, and the at least one photovoltaic string connected to the first inverter comprises a first photovoltaic string; and after starting, at the IV curve scanning start time of the first inverter, to perform the IV curve scanning on at least one photovoltaic string connected to the first inverter, the method further comprises:

comparing, by the first inverter, fall phase scanning data of the first photovoltaic string in the fall phase scanning period with rise phase scanning data of the first photovoltaic string in the rise phase scanning period; and outputting an IV curve scanning result of the first photovoltaic string based on a comparison result.

11. The method according to claim 8, wherein the power supply system further comprises a Ni—Cd battery, a NiMH battery, a lithium-ion battery, or a lithium polymer battery disposed between the inverter and a power grid.

12. The method according to claim 8, wherein a plurality of photovoltaic strings are connected to the first inverter, and the plurality of photovoltaic strings are connected in parallel.

13. The method according to claim 8, wherein a plurality of photovoltaic strings are connected to the first inverter, and the plurality of photovoltaic strings comprise a plurality of photovoltaic modules that are connected in series.

14. A power supply system, comprising:

a system control unit and at least two inverters that establish a communication connection to the system control unit, each of the at least two inverters is configured to connect to at least one photovoltaic string, and the at least two inverters comprise a first inverter and a second inverter;

the system control unit is configured to: send a first current-voltage (IV) curve scanning instruction to the first inverter, and send a second IV curve scanning instruction to the second inverter;

the first inverter is configured to start, at an IV curve scanning start time of the first inverter, to perform IV curve scanning on at least one photovoltaic string connected to the first inverter, wherein the IV curve scanning start time of the first inverter is determined based on a moment at which the first IV curve scanning instruction is received and a delay duration of the first inverter; and the second inverter is configured to start, at an IV curve scanning start time of the second inverter, to perform IV curve scanning on at least one photovoltaic string connected to the second inverter, wherein the IV curve scanning start time of the second inverter is determined based on a moment at which the second IV curve scanning instruction is received and a delay duration of the second inverter, and the IV curve scanning start time of the first inverter and the IV curve scanning start time of the second inverter are different, and a time interval between the IV curve scanning start time of the first inverter and the IV curve scanning start time of the second inverter is less than a preset IV curve scanning period;

wherein the delay duration of the first inverter is $T/N*(n_1-1)$, and the delay duration of the second inverter is $T/N*(n_2-1)$, wherein T is the preset IV curve scanning period, N is the quantity of the at least two inverters, $n_1$ is ranking of the first inverter in the at least two inverters, and $n_2$ is ranking of the second inverter in the at least two inverters.

15. The power supply system according to claim 14, wherein, when the first inverter is connected to a plurality of photovoltaic strings, starting, at the IV curve scanning start time of the first inverter, to perform the IV curve scanning on at least one photovoltaic string connected to the first inverter comprises:

starting, by the first inverter at the IV curve scanning start time of the first inverter based on a preset scanning sequence, to sequentially perform IV curve scanning on the photovoltaic strings connected to the first inverter.

16. The power supply system according to claim 14, further comprising a Ni—Cd battery, a NiMH battery, a lithium-ion battery, or a lithium polymer battery disposed between the inverter and a power grid.

17. The power supply system according to claim 14, wherein a plurality of photovoltaic strings are connected to the first inverter, and the plurality of photovoltaic strings are connected in parallel.

18. The power supply system according to claim 14, wherein a plurality of photovoltaic strings are connected to the first inverter, and the plurality of photovoltaic strings comprise a plurality of photovoltaic modules that are connected in series.

* * * * *